US 8,552,740 B2

(12) United States Patent
Cheung et al.

(10) Patent No.: US 8,552,740 B2
(45) Date of Patent: Oct. 8, 2013

(54) METHOD OF MEASURING DELAY IN AN INTEGRATED CIRCUIT

(75) Inventors: Peter Ying Kay Cheung, London (GB); Nicholas Peter Sedcole, Isey-les-Moulineaux (FR); Justin Sung-Jit Wong, London (GB)

(73) Assignee: Maxeler Technologies Limited, London (GB)

( * ) Notice: Subject to any disclaimer, the term of this patent is extended or adjusted under 35 U.S.C. 154(b) by 409 days.

(21) Appl. No.: 12/747,650

(22) PCT Filed: Dec. 10, 2008

(86) PCT No.: PCT/GB2008/004069
§ 371 (c)(1),
(2), (4) Date: Jan. 5, 2011

(87) PCT Pub. No.: WO2009/074790
PCT Pub. Date: Jun. 18, 2009

(65) Prior Publication Data
US 2011/0095768 A1    Apr. 28, 2011

(30) Foreign Application Priority Data
Dec. 11, 2007  (GB) .................................. 0724177.1

(51) Int. Cl.
*G01R 23/12* (2006.01)
*G01R 23/175* (2006.01)
*G06F 19/00* (2011.01)

(52) U.S. Cl.
USPC ..................... 324/617; 324/76.53; 324/76.35; 702/125

(58) Field of Classification Search
USPC .................... 324/617, 76.35, 76.53; 702/125
See application file for complete search history.

(56) References Cited

U.S. PATENT DOCUMENTS
2006/0217919 A1* 9/2006 Sotiriou ........................ 702/125
2007/0057715 A1  3/2007 Yeh et al.

FOREIGN PATENT DOCUMENTS
WO  WO 2008/023152 A1  2/2008

OTHER PUBLICATIONS

Wong, Justin "Self-Measurement of Combinatorial Circuit Delays in FPGAS" Field-Programmable Technology, 2007. ICFPT 2007. International Conference on, IEEE, PI (Dec. 12, 2007), pp. 17-23, XP031208368.
Premachandran R. Menon et al., "Design-Specific Pathy Delay testing in Lookup-Table-Based FPGAS" IEE Transactions on Computer-Aided Design on Integrated Circuits and Systems, vol. 25, No. 5, May 5, 2006 pp. 867-877.
European Patent Office, "International Search Report" dated Mar. 30, 2009, application No. PCT/GB2008/004069., 5 pages.

* cited by examiner

*Primary Examiner* — Melissa Koval
*Assistant Examiner* — Farhana Hoque
(74) *Attorney, Agent, or Firm* — Hickman Palermo Truong Becker Bingham Wong LLP

(57) ABSTRACT

A method of measuring signal delay in a integrated circuit comprising applying a common clock signal at a circuit input and output, applying a test signal at the circuit input, detecting a corresponding output signal at the circuit output and detecting whether the test signal and output signal occur in a common part of the clock signal.

26 Claims, 4 Drawing Sheets

METHOD OF MEASURING DELAY IN AN INTEGRATED CIRCUIT

This application is filed under 35 USC 371 and claims priority as a United States national stage application from prior PCT international application number PCT/GB2008/004069, having an international filing date of 10 Dec. 2008, which claims priority to Great Britain application 0724177.1, filed 11 Dec. 2007, the entire contents of which are hereby incorporated by reference for all purposes as if fully set forth herein.

The invention relates to integrated circuit (IC) technology; specifically, the invention relates to the measurement of delay such as signal propagation delay for example between signal nodes in digital integrated circuits.

BACKGROUND OF INVENTION

As technology scaling of semiconductor integrated circuits continues to improve, it is increasingly difficult to manufacture complex integrated circuits with reasonable manufacturing yields. As feature sizes decrease, the likelihood of having defects on a large chip increases. Even more serious is the problem of the unpredictability inherent in the manufacturing process. The production of integrated circuits is a complex manufacturing process involving many steps. Each manufacturing step has many parameters, which must be precisely controlled to ensure the manufactured devices are as close as possible to being uniform in their characteristics. Any deviation from the ideal value in a process parameter may cause a deviation from the ideal characteristic in the manufactured product, which is referred to as process variation.

Process variation is often translated to high variation in the delay along signal paths within the integrated circuit. In other words, the delay between two nodes of a digital integrated circuit for different manufactured parts of the same design can range from $D_{fast}$ to $D_{slow}$, and the difference $D_{fast}-D_{slow}$ is expected to increase in the future as feature sizes become smaller (say, towards 10 nm).

Even more serious is the deterioration of the performance in integrated circuits over time. Greater current densities and higher electrical field strengths in future technologies are expected to accelerate the ageing of integrated circuits, degrading its performance in the form of increased signal path delays until the circuit no longer functions according to specification.

Integrated circuits such as Programmable Logic Devices (PLDs), which include Field-Programmable Gate Arrays (FPGAs), are a type of digital integrated circuit where the circuit functions are not completely defined during manufacturing. The exact function of the logic circuits within a PLD is determined by the user by programming the device. The programming file is known as a "configuration bitstream", and is generated by the execution of a CAD (computer-aided design) tool flow which includes a "place and route" step and a "bitstream generation step". The execution time of the CAD tool flow for a latest-generation PLD is typically many minutes to several hours, even on a high-end workstation.

International patent application No. PCT/GB2007/003152 commonly owned herewith discloses a method where the mapping between circuit functions and the actually hardware is not fixed during manufacturing, but can be changed after the device has been deployed, during power-up, or even while it is functioning in-situ.

The present invention discloses a method of delay measurement within a PLD, which may also be applied to other digital integrated circuits which are not programmable in the way that a PLD is.

SUMMARY OF THE INVENTION

The invention is set out in the claims. Embodiments thus provide a means for measuring accurately the propagation delay between two signal nodes S and D in an integrated circuit. As it is possible to measure accurately the delay between nodes, it is possible to map the fastest signal path as determined by the specification to the fastest part of the PLD on a per device basis during power-up. It is also possible to monitor the delay of specific path in order to determine lifetime deterioration of the device with the view of re-mapping the part of the circuit that has become too slow due to degradation of the device during use to another part of the device which meets the delay requirement.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

DETAILED DESCRIPTION OF THE PREFERRED EMBODIMENTS OF THE INVENTION

Figure 1:
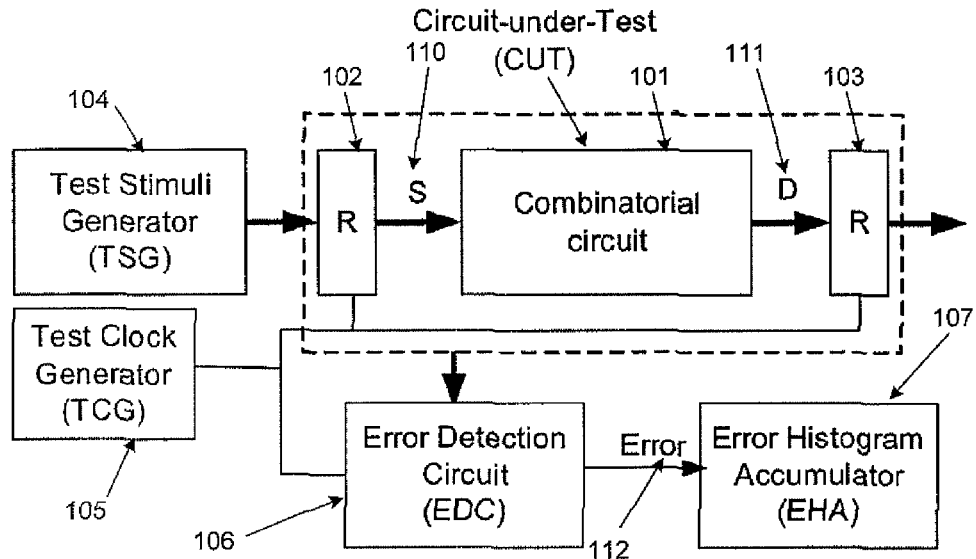
FIG. 1: Diagram depicting the basic principle of the delay measurement method

In an embodiment the method can use a flexible on-chip clock generator, such as a phase locked loop circuit, as would normally be found in a modern digital integrated circuit. By placing the circuit-under-test (CUT) between the two signal nodes S and D within a built-in-self-test (BIST) circuit which includes two clocked registers and other circuit structures, the CUT is stepped through a range of frequencies until timing failure is detected. The frequency at which timing failure first occurs provides a direct measurement of the path delay between two signal nodes. All clock generators has some uncertainty in the period of the clock signals known as clock jitter. In embodiments of the present invention, the error introduced by clock jitter is eliminated by taking multiple measurements of the failure frequencies. A cumulative histogram can then be constructed from which the actual failure frequency, hence the path delay, is derived.

Most previous methods to measure on-chip delay on FPGAs are based on direct measurements of frequency or time. The method proposed in this disclosure performs indirect measurement based around stepping the frequency of an on-chip clock generator. The circuit-under-test (CUT) (101) is sandwiched between two pipeline registers R (102) and (103) at the circuit input and output respectively which are clocked by a signal produced by a test clock generator (TCG) (105), the frequency of which is stepped between a lower and an upper bound. A test stimuli generator (TSG) (104) provides a test signal as stimuli S (110), which is latched at the circuit input by the register (102), to the CUT (101) such that the output signal D (111) toggles after $t_{delay}$, which is the path delay to be measured. The output signal D (111) is latched at the circuit output by register (103). As the clock signal is stepped from the lower to the upper bound, the CUT (101) transits from operating correctly—when the corresponding transitions of the stimuli signal S and output D occur in the same part of the clock cycle (taking into account any inherent latencies such as propagation delays)—to operating with timing error as the frequency increases and the transitions of the stimuli S and output D do not fall in the same part of the clock cycle, for example after it has transitioned from a first to a second state. The same part of the clock cycle may be, for example, the interval while the clock is in a common state such as high or low—i.e. half a clock period or could be for example, the entire clock period. The error detection circuit (EDC) (106) monitors particularly internal signals in the CUT (101) and the register (103) in such a way that the signal Error (112) is high if a timing error is detected. Optionally the error histogram accumulator EHA (107) stores the error count at each frequency to facilitate the building of a cumulative error histogram against the test clock frequency. From this, the frequency at which the circuit fails, and hence the delay of CUT (101) can be found.

Provided the circuit-under-test is inside an integrated circuit that has a flexible on-chip clock generator, which is the case in many digital integrated circuits, including Programmable Logic Devices such as FPGAs, any combinatorial circuit and path delay can be measured without the need for external circuitry. The precision of the delay measurement is determined by how finely the frequency of the TCG (105) can be stepped. If the CUT (101) works at frequency f, but fails at frequency f+Δf, the delay of the CUT (101) is between $$t_1 = \frac{1}{f} \text{ and } t_2 = \frac{1}{f+\Delta f}. \quad \text{(Equation 1)}$$

The delay time resolution is given by:

$$\Delta t = t_1 - t_2 = f^{-1} - f^{-1}\left(1 + \frac{\Delta f}{f}\right)^{-1} \approx \frac{\Delta f}{f^2} \quad \text{(Equation 2)}$$

Suppose f=500 MHz and Δf=0.25 MHz, the delay resolution achieved is 1 ps.

As discussed below in more detail the purpose of the Error Histogram Accumulator EHA (107) if implemented is to improve yet further the accuracy of the delay measurement. The function and the detail of the EHA will be provided later.

Figure 2:
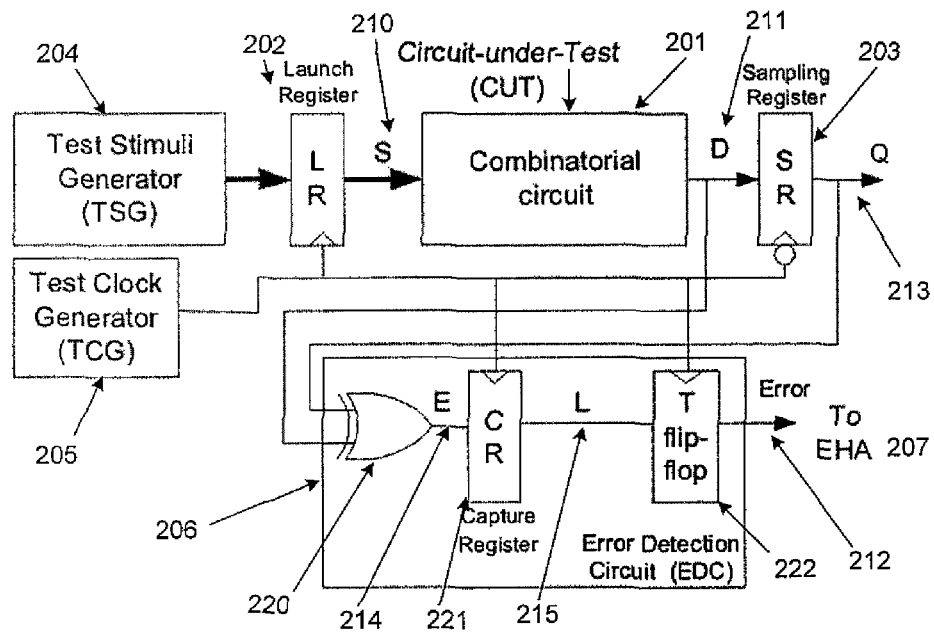
FIG. 2: Detailed diagram of the Error Detection Circuit (EDC)

The detailed implementation of the EDC (206) is shown in FIG. 2. In the present embodiment, the pipeline register comprising a launch register LR (202) and a sampling register SR (203) are clocked with opposite phases of the test clock. This implies that the stimuli S (210) must propagate across the CUT (201) in approximately half the clock period or less for the CUT to function normally. The EDC (206) compares the delayed signal D (211) and output Q (213) of the sampling register SR (203) with an XOR gate (220) whose output value will depend on whether the S and D signals fall in a common part of the clock signal and latches any late timing error E (214) with the capture register CR (221) on the rising edge of the test clock to produce a late signal L (215). This in turn causes a toggle flip-flop (222) to provide a transition, signalling an error to the EHA (207) circuit with the signal Error (212).

The output toggle flip-flop (222) serves a number of useful purposes. Firstly it reduces the error count frequency by half, reducing the self-heating effect of the EHA (207), which can be placed some distance away from the EDC. Secondly this serves as a synchronous to asynchronous interface circuit. In the present embodiment, the EHA (207) is implemented as an asynchronous counter to avoid the need for synchronization between the test clock and the error counter clock.

Figure 3:
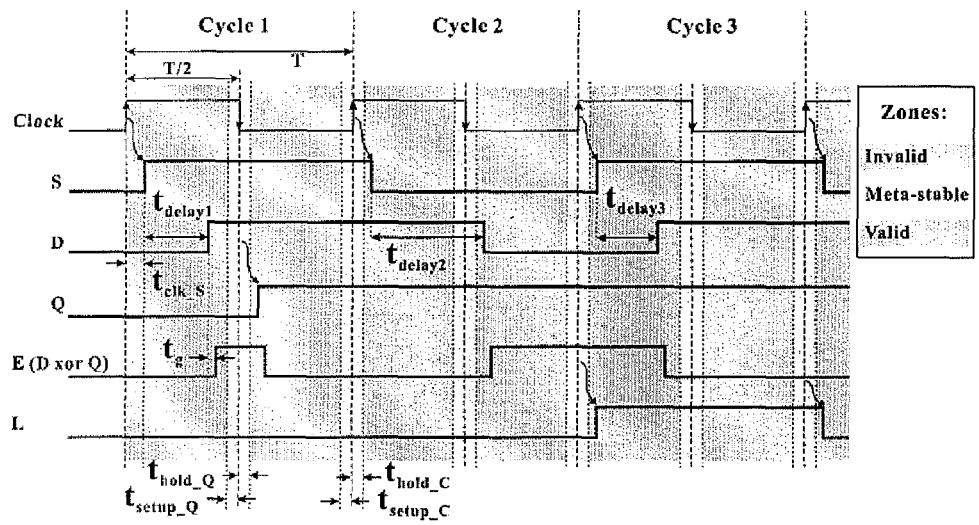
FIG. 3 Timing diagram showing timing of signals for conditions without and with late timing errors FIG. 4 Block Diagram of a PLL based test clock generator (TCG) circuit FIG. 5 a) and b): timing diagram showing a method to determine propagation delay with much reduced clock jitter error FIG. 6 Flow diagram showing an intelligent frequency search algorithm using successive approximation method

FIG. 3 illustrates the operation of the present embodiment of the delay measurement method over three test clock cycles in order to illustrate the two possibilities where the CUT (201) operate without and with timing error respectively.

In cycle 1, the CUT (201) operates without timing error. This error-free condition occurs when the transition of both stimuli S (210) and the delayed D (211) signals occur in the valid part of the clock cycle (taking into account setup, hold and delay times in LR (202) and SR (203)). This is specified with the timing constraint:

$$t_{hold\_C} - t_{clk\_S} < t_{delay1} < \frac{T}{2} - (t_{setup\_Q} + t_{clk\_S}) \quad \text{(Equation 3)}$$

where $t_{delay1}$ is the delay to be measured, T is the clock period, $t_{setup\_Q}$ and $t_{hold\_C}$ are respectively the setup and hold times of the sampling register SR (203), and $t_{clk\_S}$ is the clock to output delay of the launch register LR (202).

Furthermore, in order for the late signal L (215) to be interpreted correctly, the following must hold:

$$t_{delay1} < T - (t_{clk\_S} + t_{setup\_C} + t_g) \quad \text{(Equation 4)}$$

where $t_{setup\_C}$ is the setup time of the capture register CR (202) and $t_g$ is the propagation delay of the XOR gate (220).

Cycle 2 depicts the condition where a timing error occurs when the delayed signal D (211) occurs in the invalid period of the clock cycle. This happens when the following condition is satisfied:

$$\frac{T}{2} + t_{hold\_Q} - t_{clk\_S} < t_{delay2} < T - (t_{clk\_S} + t_{setup\_C} + t_g) \quad \text{(Equation 5)}$$

The error signal E (214) is sampled high at the beginning of cycle 3 and a late signal L (215) lasting for one clock period is produced one cycle after the timing error occurs. A counter in the EHA (207) accumulates the total late signal count $C_{Late}$ over a certain period with a total expected transition count of $C_{trans}$. The failure rate FR is simply the ratio $C_{Late}/C_{trans}$.

It will be noted that by clocking the register SR (203) for the signal D with the falling edge of the clock the relevant part of cycle during which both transitions must fall in half a clock period, while the clock state is high. Alternatively the selected half period may be low, or the register for the signal D could be clocked with the rising edge of the clock such that the relevant duration is the entire clock period. Of course any other distinguishable period can be adopted.

Figure 4:
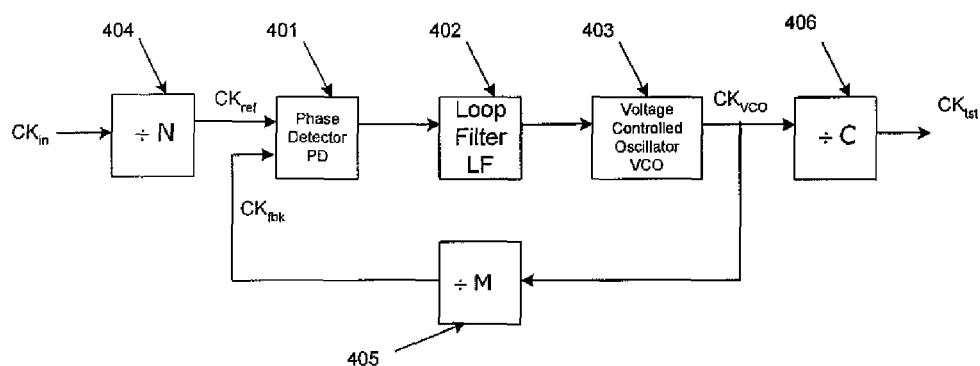

The Test Clock Generator TCG (105) can be implemented in a variety of methods. As will be well known to a person skilled in the art, for example, a phase locked loop (PLL) or a digital locked loop (DLL) could be used. FIG. 4 shows an example of a PLL used as a possible TCG. As will be well known a PLL consists of a phase detector PD (401), a loop filter LF (402) and a voltage controlled oscillator VCO (403) connected as a feedback circuit as shown in FIG. 4. Furthermore, three additional counter circuits: the ÷N pre-counter (404), the ÷M feedback counter (405) and the ÷C post-counter (406), can be added as shown in order to alter the frequency $F_{tst}$ of the output clock signal $CK_{tst}$ with respect to the frequency $F_{in}$ of the input clock signal $CK_{in}$. The relationship between the frequency of $CK_{tst}$ and $CK_{in}$ is given by:

$$F_{tst} = \frac{M}{N \times C} F_{in} \qquad \text{(Equation 5)}$$

By varying M, N or C, it is therefore possible to generate a clock signal of different frequency from the Test Clock Generator (105).

If the clock signal generated by the TCG (105) is perfect, the delay of the CUT (101) is given by Equation 1 once the frequency $F_{error}$ at which transiting from having no timing error to the presence of timing error is identified. However, a practical TCG circuit usually suffers from clock jitter, which is a variation in the period of the clock signal from cycle to cycle. Such jitter is usually symmetrical (i.e. with equal probability around a mean) and Gaussian distributed. The accuracy of the delay measurement method described above is therefore limited by the error introduced by such clock jitter. For example, if the worst case clock jitter is ±5 ps, the delay measurement will have an accuracy of ±5 ps or worse.

To improve yet further the accuracy of the delay measurement in the presence of such clock jitter, the present embodiment proposes the use of a statistical method as described below.

Figure 5A:
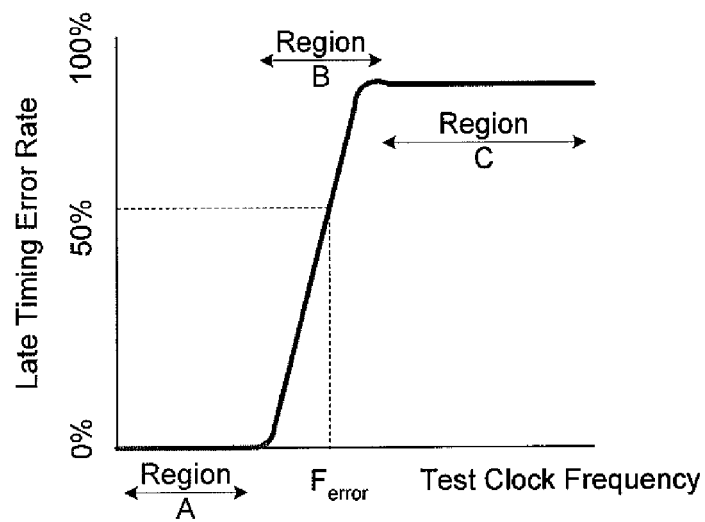

Instead of determining the delay value of the CUT (101) from the maximum frequency at which the circuit operates correctly without any timing errors, a cumulative error histogram is constructed by the EHA (107). In one embodiment, the Error Detection Circuit EDC (106) detects timing errors only for rising (or falling) transitions at D (111), and the EHA (107) accumulates a distribution as depicted in FIG. 5(a) after many repeated delay measurements are made at various test clock frequencies. An accurate delay measurement with much of the clock jitter effect removed is derived at the frequency $F_{error}$ at which the timing error probability is 0.5. The delay of CUT can then be derived using equation 1.

Figure 5B:
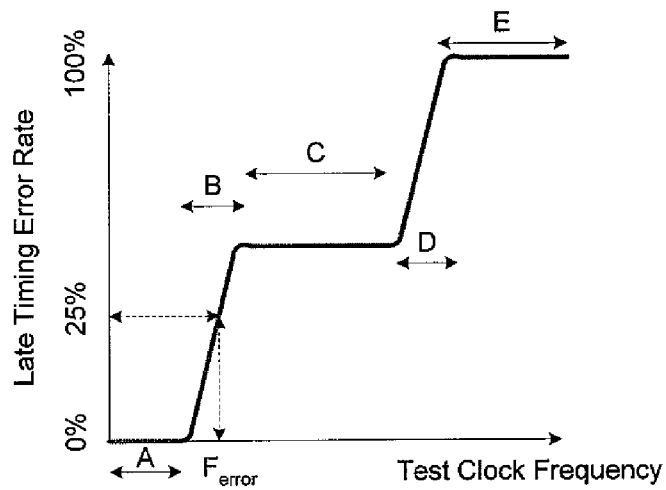

The shape of this distribution can be explained as follow. When the frequency is in Region A, the test clock is so slow that even in the presence of clock jitter, no timing error is detected for rising (or falling) transition at D (111), and therefore the timing error rate is 0. In Region B, due to the presence of clock jitter, sometime timing error occurs. Therefore the error rate is between 0 and 1. In Region C, the frequency of the test clock is so fast that timing errors always occur. Since the clock jitter distribution is assumed to be symmetrical around the nominal clock frequency, the 0.5 (50%) timing error probability point is used to derive the delay measurement for the rising (or falling) transition at D, but of course any appropriate point in region B can be selected In another embodiment, the Error Detection Circuit EDC (106) detects timing errors for both rising and falling transitions at D (111), and the EHA (107) accumulates a distribution as depicted in FIG. 5(b) after many repeated delay measurements are made at various clock frequencies. An accurate worst case delay measurement with much of the clock jitter effect removed is derived at the frequency $F_{error}$ at which the timing error probability is 0.25.

The shape of this distribution (FIG. 5(b)) can be explained as follows. Assuming that the propagation delay $t_g$ through the CUT (101) resulting in rising output transitions at D (111) are longer than the delay resulting in fall transitions, when the frequency is in Region A, the test clock is so slow that even in the presence of clock jitter, no timing error is detected for both rising and falling transition at D (111), and therefore the timing error rate is 0. In Region B, due to the presence of clock jitter, sometime timing error occurs for rising transitions at D. However, since falling transitions at D enjoys faster (i.e. lower) propagation delay, they do not cause any timing errors as, despite jitter, the shorter propagation delay means that the transition always occurs in the non-error region. Therefore the error rate is between 0 and 0.5. In Region C, all rising transitions at D result in timing errors while all falling transitions still do not. Therefore, the timing error rate is flat at 0.5. In Region D, as the frequency increases even further the falling transition at D starts to suffer from timing errors some of the time due to clock jitter despite the shorter propagation delay. In Region E, all transitions result in timing error under all clock jitter conditions and the error rate is 1.0. Since the clock jitter distribution is assumed to be symmetrical around the nominal error clock frequency $F_{error}$, the worse case delay propagation (which is for the slower rising transition at D in this case) can be derived from the 0.25 timing error probability point. Similar, the delay propagation for the faster falling transition at D can be derived from the 0.75 timing error probability point. Of course where the rising propagation delay is shorter than the falling propagation delay the approach described above can be tailored accordingly.

Building a cumulative distribution as shown in FIG. 5(a) or (b) does not mean that the entire distribution needs to be obtained. Assuming that the EDC is detecting timing errors for both rising and falling transition at D (i.e. the case shown in FIG. 5(b)), there are many ways that the required frequency $F_{error}$ can be obtained with a much smaller number of test clock frequency values than all possible clock frequency values $F_{tst}$ as a full distribution would require.

In a first method, the test clock frequency $F_{tst}$ can be incremented from the lowest frequency towards the highest frequency in small steps as dictated by the TCG (105). For each frequency value of $F_{tst}$, the timing error rate is determined by counting the number of times that a timing error occurs and dividing this by the number of elapsed clock cycles. In order to determine the worst case propagation delay from S (110) to D (111), there is no need to go beyond the 0.25 timing error rate point. Therefore $F_{error}$ is determined once the 25% error rate is reached.

Figure 6:
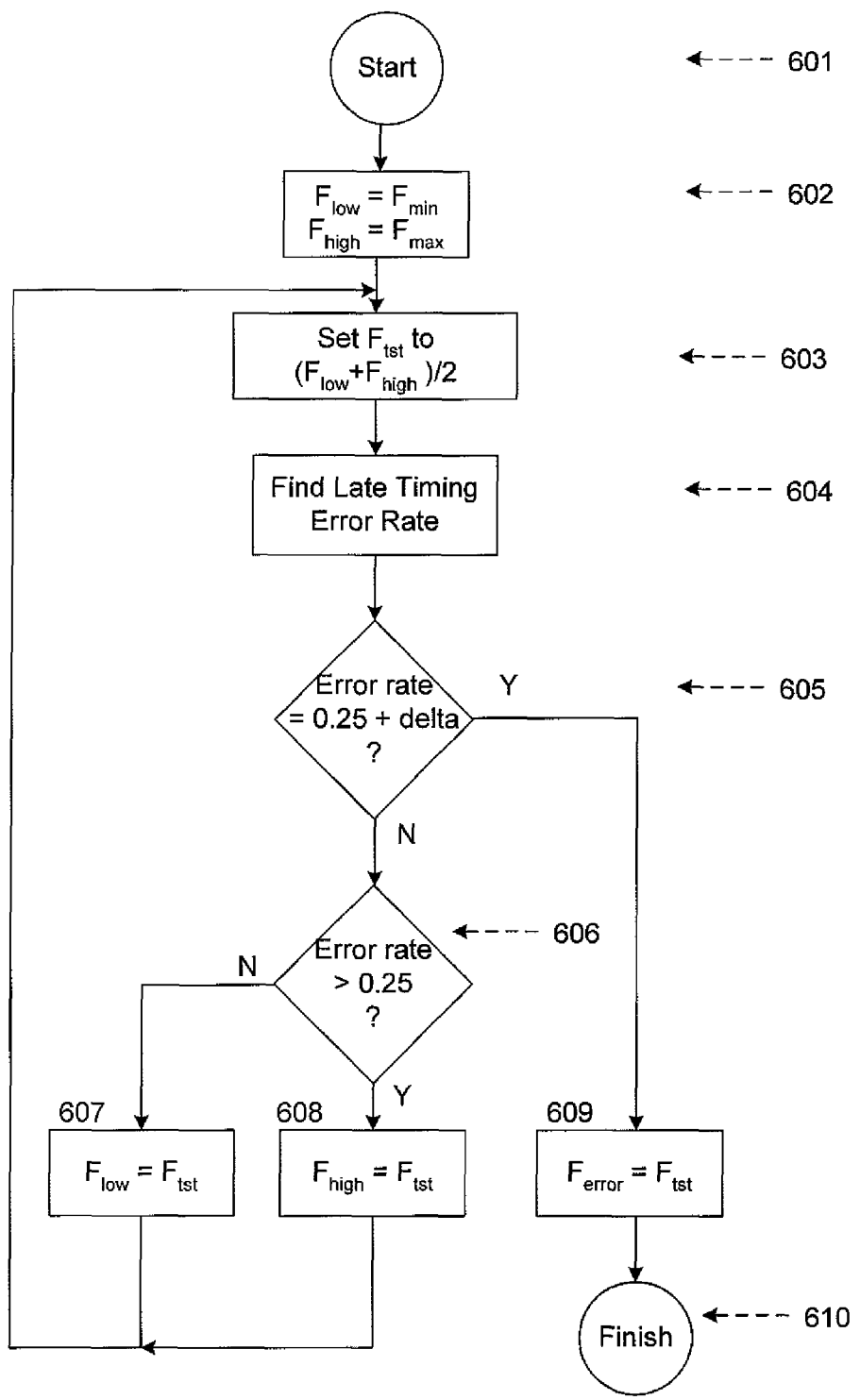

In a second method, the test clock frequency value $F_{tst}$ are chosen using a more intelligent algorithm such as the successive approximation method. This method is depicted in FIG. 6. The algorithm starts at step 601. A low frequency value $F_{low}$ and a high frequency value $F_{high}$ are respectively set to the minimum ($F_{min}$) and maximum ($F_{max}$) frequencies that the TCG can produce in step 602. The TCG is then set to the frequency $F_{tst}$ closest to $(F_{high}-F_{min})/2$, i.e. the mid-point between these two extreme frequencies, in step 603 or the closest available frequency where appropriate—for example, where the TCG is implemented using a practical circuit such as a PLL this may not be able to generate the exact frequency required. In step 604, the timing error rate is accumulated. In step 605, this error rate is compared to the required value 0.25 (in this case), assuming a worst case scenario based around the shortest propagation delay within an error bound of delta, which may be, for example 0.01. If the comparison is true, the value of $F_{error}$ is found (step 609) and the worst case delay of the path from S (110) to D (111) is given by $1/F_{error}$. The algorithm terminates at 610. Otherwise, if the error rate is higher than the required value of 0.25, then $F_{high}$ is reduced to $F_{tst}$ in Step 608. If the error rate is lower than the required value of 0.25, then $F_{low}$ is increased to $F_{tst}$ in Step 607. In both case, the algorithm returns to step 603 for another iteration.

In a third method, a plurality of timing error rates are obtained at a plurality of test clock frequencies. One of many possible interpolation techniques may be used to obtain a good estimate for the value of $F_{error}$, for example by assuming a linear relationship and deriving the desired error rate and the corresponding value of $F_{error}$.

It will be seen that, once the delay information has been derived then appropriate steps can be taken in relation to the device. For example where the device is a programmable logic device then the respective speed of multiple paths can be identified and the device configured to make optimum use of the varying path speeds. In a further approach, during the life of a PLD, making use where appropriate of the internal clock facility, the speed of the paths can be periodically checked to establish whether there is deterioration and if so the PLD can be remapped or re-configured to re-optimise operation and use of the new path speed distribution.

In the following above description of the present invention numerous specific details are set forth, such as the specific timing error detection circuit, the test clock generator, the cumulative histogram method, the way to select different clock frequencies at which timing error are measured etc., in order to provide a thorough understanding of the present invention and it will be appreciated that any appropriate component and techniques can be accepted to implement the various features. However, it will be obvious to one skilled in the art that the present invention may be practiced without these specific details. In other instances well known methods, functions, components and procedures have not been described in detail as not to unnecessarily obscure the present invention. Furthermore, the present invention can easily be modified in such a way that different circuit implements and measurement algorithms may be employed.

The invention claimed is:

1. A method of measuring signal delay in an integrated circuit comprising:
    applying a clock signal at a first register input and a second register input,
    applying a test signal to an input of the first register, wherein an output signal S from the first register is input to a circuit under test, and wherein an output signal D from the circuit under test is input into the second register, based on an output signal from the second register and the output signal D, detecting whether the output signal S and output signal D occur in a common part of the clock signal.

2. A method as claimed in claim 1 further comprising varying a clock signal frequency of the clock signal until the output signal S and output signal D do not fall in a common part of the clock signal.

3. A method as claimed in claim 2 comprising varying the frequency by incrementally increasing the frequency.

4. A method as claimed in claim 2 comprising, setting a minimum clock frequency and maximum clock frequency, setting the actual clock frequency between said minimum clock frequency and maximum clock frequency, if the output signal S and output signal D fall in the common part of the clock signal, setting the actual frequency as the new minimum frequency, if the output signal S and output signal D do not fall in a common part of the clock signal, setting the actual frequency as the maximum frequency and repeating the steps.

5. A method as claimed in claim 2, further comprising:
    making multiple repetition of the steps at various clock signal frequencies; and
    constructing a cumulative distribution of the number of times the output signal S and the output signal D do not occur in a common part of the clock signal at the various clock signal frequencies.

6. A method as claimed in claim 5, wherein constructing the cumulative distribution is based on only one of rising or falling transitions in the output signal S and the output signal D.

7. A method as claimed in claim 6, further comprising deriving a measure of delay based on the clock signal frequency for which the probability of the cumulative distribution is 0.5.

8. A method as claimed in claim 5, wherein constructing the cumulative distribution is based on both of rising and falling transitions in the output signal S and the output signal D.

9. A method as claimed in claim 8, further comprising deriving a measure of delay based on the clock signal frequency for which the probability of the cumulative distribution is 0.25.

10. A method as claimed in claim 1 further comprising deriving a signal delay value dependent on the clock frequency.

11. A method as claimed in claim 1 in which the common part of the clock signal corresponds to an interval during which the clock signal occupies the same state, or to a full clock period.

12. A method as claimed in claim 1 in which the step of detecting whether the output signal S and output signal D fall in the common part of the clock signal is determined taking into account latencies in the circuit.

13. A method as claimed in claim 1 in which the output signal S and output signal D comprise at least of one corresponding rising or falling signal transitions.

14. A method as claimed in claim 1 in which the common clock signal is generated within the integrated circuit.

15. A method as claimed in claim 1 further comprising storing values of clock frequency and corresponding occurrences of the output signal S and output signal D falling or not falling within a common part of the clock signal.

16. A method as claimed in claim 15 in which the values are stored as a count and the count is incremented using a flip flop component.

17. A method as claimed in claim 15 in which the values are stored for only one of corresponding rising or falling transitions in the output signal S and output signal D.

18. A method as claimed in claim 15 in which the values are stored for both of corresponding rising and falling transitions in the output signal S and output signal D.

19. A method as claimed in claim 15 further comprising identifying a clock signal frequency occurring in a transition region between regions where all output signals S and output signals D fall in a common part of the clock signal and where all output signals S and output signals D do not fall in a common part of the clock signal, and deriving a measure of delay from said clock signal frequency.

20. A method as claimed in claim 19 in which the transition region is selected to correspond to a worst case internal latency value.

21. A method as claimed in claim 1 further comprising attributing a delay to each of multiple signal paths, mapping the signal paths and providing a path delay map for the integrated circuit.

22. A method as claimed in claim 21 further comprising assigning integrated circuit functions according to the path delay map.

23. A method as claimed in claim 22 further comprising remeasuring signal delays after a predetermined period of operation of the integrated circuit and remapping functions dependent on any changes in the path delay map.

24. A method as claimed in claim 1 in which the integrated circuit comprises a programmable logic integrated circuit.

25. A method of designing an integrated circuit comprising measuring delay according to a method as claimed in claim 1, providing a path delay map and assigning integrated circuit function according to the path delay map.

26. An apparatus for measuring signal delay in an integrated circuit comprising
- a first register;
- a second register;
- a clock signal generator configured to apply a common clock signal at a first register input and a second register input, wherein an output signal S from the first register is configured to be applied as input to a circuit under test, and wherein an output signal D from the circuit under test is configured to be applied as input into the second register, a test signal generator configured to apply a test signal to an input of the first register, and a detector configured to detect whether the output signal S applied at the input and an output signal D detected at the output fall in the common part of the clock signal.

* * * * *